United States Patent [19]

Grace

[11] 3,883,823

[45] May 13, 1975

[54] BROAD BAND HIGH FREQUENCY CONVERTER WITH INDEPENDENT CONTROL OF HARMONIC FIELDS

[75] Inventor: Martin I. Grace, Framingham, Mass.

[73] Assignee: Sperry Rand Corporation, New York, N.Y.

[22] Filed: July 8, 1974

[21] Appl. No.: 486,546

[52] U.S. Cl. .................. 331/107 R; 330/34; 330/56; 331/101

[51] Int. Cl. .............................................. H03b 5/12

[58] Field of Search ............ 331/107 R, 101, 107 G, 331/107 T, 102, 99; 330/34, 56

[56] References Cited

UNITED STATES PATENTS

| | | | |
|---|---|---|---|
| 3,571,750 | 3/1971 | Carlson | 331/107 |
| 3,646,581 | 2/1972 | Grace | 330/56 |
| 3,673,510 | 6/1972 | Grace et al. | 330/34 |
| 3,714,605 | 1/1973 | Grace et al. | 331/107 R |

*Primary Examiner*—John Kominski
*Attorney, Agent, or Firm*—Howard P. Terry

[57] ABSTRACT

An active high-efficiency-mode semiconductor device is coupled to oscillating high frequency fields in a transmission line network for amplifying those fields, the apparatus taking the form of a single port device. The transmission line network provides means for the control of the fundamental and odd harmonic energy in the vicinity of the active semiconductor element and for independent control of even harmonic energy in that region in a system avoiding time delayed triggering of undesired oscillations within the converter.

8 Claims, 4 Drawing Figures

BROAD BAND HIGH FREQUENCY CONVERTER WITH INDEPENDENT CONTROL OF HARMONIC FIELDS

The invention herein described was made in the course of or under a contract or subcontract thereunder with the United States Air Force.

BACKGROUND OF THE INVENTION

1. Field of the Invention

The invention pertains to high frequency transmission line semiconductor diode energy converters such as amplifiers and oscillators and more particularly relates to means in such semiconductor energy converter devices for achieving independent control over harmonic fields in the vicinity of the semiconductor diode.

2. Description of the Prior Art

High-efficiency-mode diode converters have been realized that avoid time-delayed triggering of undesired oscillations through beneficial control of fundamental and harmonic energy in the vicinity of the diode. Such has been accomplished in prior converter devices employing a high-efficiency-mode semi-conductor diode as an active negative resistance device in a transmission line network. A filter located at the diode is provided with a stop band containing certain harmonics of the frequency of the signal to be amplified, while being transparent to the latter signal. The network is tuned to resonate the signal frequency to be amplified. With the special location of the filter, time delayed triggering of the diode is not induced. A unidirectional potential is applied across the high-efficiency-mode semiconductor diode such that it is biased near its breakdown level. The high frequency signal, when superimposed upon the bias potential, produces large changes in the instantaneous diode voltage and current, which changes are such that a large negative resistance is generated at the same frequency as the fundamental frequency of the applied high frequency signal. The consequent current wave contains many harmonic components which are also coupled to the oscillating harmonic high frequency field to produce amplified harmonic signals, thereby improving the efficiency of the diode converter.

Such arrangements have limitations imposing bounds upon achievable efficiency, limitations apparently seated in the nature of the filter and impedance controlling elements employed and in the configuration in which they are assembled. In general, separate control over the odd and even harmonic energy at the active diode has not been possible, the converters being biased using networks directly coupled to the diode. The prior bias and impedance controlling circuits, in particular, do not permit sufficient control of the network impedance seen by the diode; consequently, the contribution to improved efficiency which could be made by effective use of even harmonic energy has not been realized.

SUMMARY OF THE INVENTION

The invention is a high frequency transmission line semiconductor diode energy converter, amplifier, or oscillator including novel means for achieving independent control over harmonic fields in the vicinity of the semiconductor diode. The converter employs a high-efficiency-mode semiconductor diode as an active negative resistance device in a transmission line network. A filter network located at the diode has a stop band containing certain harmonics $f_H$ of the frequency $f_F$ of the signal to be amplified, while being transparent to the latter signal. The network is tuned to resonate at the signal frequency $f_F$ to be amplified. With the special location of the filter, time delayed triggering of the diode is again not induced. According to the invention, independent control over the action of the even harmonic energy in the vicinity of the active diode is exercised by impedance control agencies exterior of the portion of the converter in which the semiconductor diode resides with consequent enhancement of efficiency.

DESCRIPTION OF THE PREFERRED EMBODIMENTS

Figure 1:
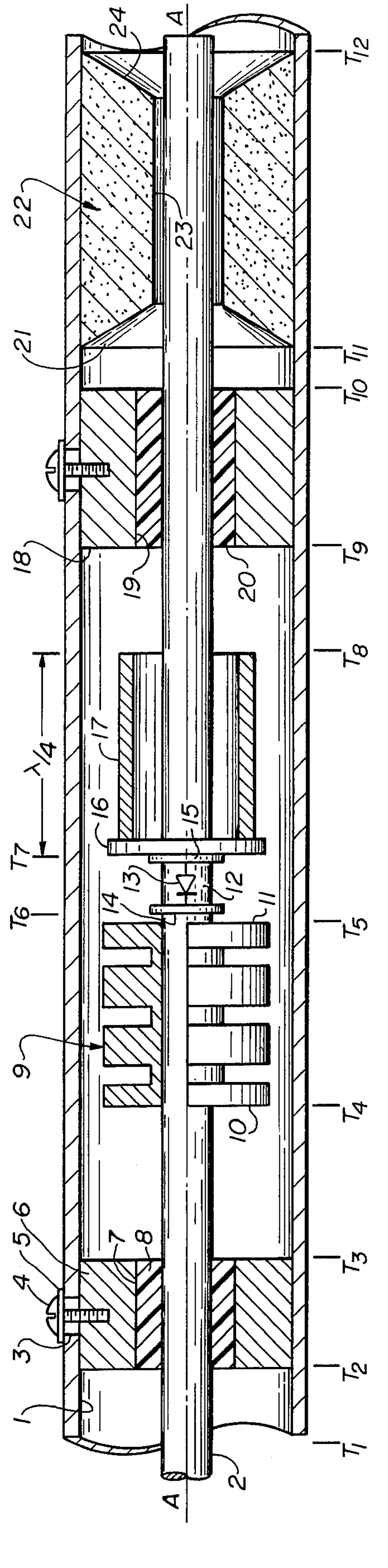
FIG. 1 is a cross section view of a preferred embodiment of the invention.

FIG. 1 illustrates a preferred embodiment of the invention in the form of a network system circularly symmetric about the dot-dash line A—A and employing, by way of example, an outer hollow tubular conductor 1 concentrically surrounding an inner conductor 2 which may be in the form of a round rod. As will be seen, inner conductor 2 is conveniently supported within the hollow outer conductor 1 by the impedance controlling elements 6 and 18, which will be further described. Propagating high frequency energy is substantially confined within the space to the left of reference plane $T_7$, the active structure being in effect closed at the general plane of surface 15. As is the usual case in high frequency or microwave structures, the respective current carrying surfaces of conductors 1 and 2 are of good electrical conductivity for high frequency currents, as are the other high frequency current carrying elements of the invention. The impedance of the coaxial line formed by conductors 1 and 2 may, for example, be 50 ohms.

It will be understood that the apparatus of FIG. 1 will be connected to high frequency utilization apparatus adjacent the reference plane $T_1$. If the apparatus is used as a high frequency oscillator, a conventional coupling at plane $T_1$ may be made directly to utilization equipment. On the other hand, if the apparatus is employed as an amplifier, the system coupled adjacent reference plane $T_1$ will often include a conventional high frequency circulator with an input port connected to a source of oscillations and an output port connected to a utilization device.

The active portion of the invention is illustrated as being generally similar to that taught in the M. I. Grace et al. U.S. Pat. No. 3,673,510 for a "Broad Band High Efficiency Amplifier," issued June 27, 1972, and in the M. I. Grace U.S. Pat. No. 3,646,581 for a "Semiconductor Diode High Frequency Signal Generator," issued Feb. 29, 1972, both patents being assigned to the Sperry Rand Corporation. Biasing arrangements conventionally employed with high efficiency converters of the present kind are disclosed in the latter patent and elsewhere in the literature. An additional oscillator-amplifier of the general type of the present invention is that disclosed in the M. I. Grace U.S. Pat. No. 3,714,605 for a "Broad Band High Efficiency Mode Energy Converter," issued Jan. 30, 1973 and assigned to the Sperry Rand Corporation. It will be understood that the active portion of the converter of FIG. 1 may take other forms compatible for use with the present invention.

The active portion of the invention to the left of reference plane $T_7$ includes an adjustable impedance controlling or tuning element lying between reference planes $T_2$ and $T_3$. The impedance transformer element 6 comprises a circular ring-shaped conducting element whose diameter permits it to be inserted in contact with the inner wall of tubular conductor 1. Where coaxial transmission line 1, 2 has a 50 ohm impedance, transformer 6 may have, for instance, a 20 ohm impedance. Like conductors 1 and 2, its surfaces exposed to high frequency energy are made of good high-frequency-current conducting material. The tuner element 6 may be provided with means permitting it to be translated longitudinally for adjustments within conductor tube 1. A short longitude slot 3 cut through the wall of tube 1 permits annular element 6 to be adjusted in position and then to be fastened by tightening screw 4 against washer 5, screw 4 being threaded into a mating threaded hole in element 6. Additional matching elements generally of the described type may be used in the well-known manner to extend the operating band width of the device. In the present invention, a dielectric tube 8 is fastened within the tuner 6 at surface 7 by cementing or by other known means. Left free to slide on the surface of inner conductor 2, the dielectric tube 8 readily forms a convenience insulating support for inner conductor 2.

The active portion of the converter next includes a low or band pass filter 9 situated on the center conductor 2 and spaced from the tuner or impedance controlling element 6. It is understood that the distributed filter 9 may be a triple or multiple section low-pass filter of the well-known Tchebycheff type, such as illustrated in the aforementioned U.S. Pat. No. 3,673,510, though other filters having related properties may be employed. The filter 9 may alternatively be made to pend from the inner conducting surface of outer coaxial conductor 1. In either type of construction, filter 9 may be made translatable longitudinally for adjustment purposes in the general manner in which impedance transformer 6 is made adjustable; reference planes $T_4$ and $T_5$ are associated with it.

The end 11 of filter 9 is placed at the active semiconductor diode 12 of the converter and is selected so that the operating fundamental frequency $f_F$ of the converter falls in the pass band of the filter 9 and also so that its stop band contains at least the second and third harmonics of the operating fundamental frequency. This adjustment aids in retaining harmonic energy in the region about diode 12, permitting efficient operation of diode 12 without the appearance of harmonic energy in the output of the converter. Thus, the band stop properties of filter 9 confine substantially all third harmonic flow to the diode itself. The wall 11 of the distributed filter is preferably placed as close as possible to the surface 14 of the diode 12, though some separation between walls 11 and 14 is permissible.

Diode 12 has its surface 15 opposite surface 14 affixed in a conventional manner to a broad surface of a conducting disk 16. The high efficiency mode diode 6 is illustrated in the drawing in a view representing its general external appearance; it is electrically poled as symbolically indicated by the representation 13 shown as actually drawn on the surface of the diode package. Diode 12 may be supported at the walls 14 and 15 at the respective reference planes $T_6$ and $T_7$ by a conventional conductive cement or may otherwise be held in place by conventional means. The diode 12 is of the general type in the art as an avalanche transit time diode or TRAPATT diode. Such diodes include step or abrupt junction diodes or other diodes designed so that, with an electrical field of suitable amplitude present, the field punches through a substrate at reverse break down.

It will be recognized that the portion of the invention of FIG. 1 thus far described is substantially similar to active amplifier and oscillator networks presented in the aforementioned patents. The present invention provides between reference planes $T_7$ and $T_{12}$ a novel bias and control circuit which may be used in such configurations and additionally in other high frequency signal converters. The folded choke bias circuit of the present invention permits control of the impedance seen by the semiconductor diode 12 at even harmonic fields in such a manner as to improve significantly the direct current to high frequency energy conversion of TRAPATT oscillators and amplifiers and, if desired, to decrease the direct current operating power of the TRAPATT device.

In the present invention, the usual substantial short circuit for high frequency fields is replaced by a half wave length or second harmonic folded choke 16, 17 through which the inner conductor 2 extends. The choke includes a hollow cylinder 17 of good conducting material fastened concentrically to the surface of disk 16 opposite diode 12. Since the tube 17 is a quarter wave length long at the operating frequency, the effect of the device is to form a half wave length folded choke at the operating wave length, extending between reference planes $T_7$ and $T_8$.

Spaced from choke 17 between reference planes $T_9$ and $T_{10}$ is an impedance matching device or second harmonic tuner 18 generally similar in structure to the tuner element 6. It is seen that tuner element 18 includes a circular ring-shaped annulus contacting the inner wall of outer conductor 1 and that it is also supplied at its inner surface 19 with a dielectric tube or sleeve 20, thus providing a second insulated support for inner conductor 2 relative to outer conductor 1. If desired, the transformer 18 may be made longitudinally translatable in the same general manner as tuner element 6.

Spaced apart from tuner 18 is an annular energy absorbing element 22 preferably cemented in position at the inner wall of outer conductor 1 between reference planes $T_{11}$ and $T_{12}$. The energy absorbing element 22 is supplied with a central clearance hole 23 through which inner conductor 2 projects. The element 22 may include concave tapers 21 and 24 at its ends and will be constructed of commercially available polyiron or other high frequency energy absorbing material.

Figure 2:
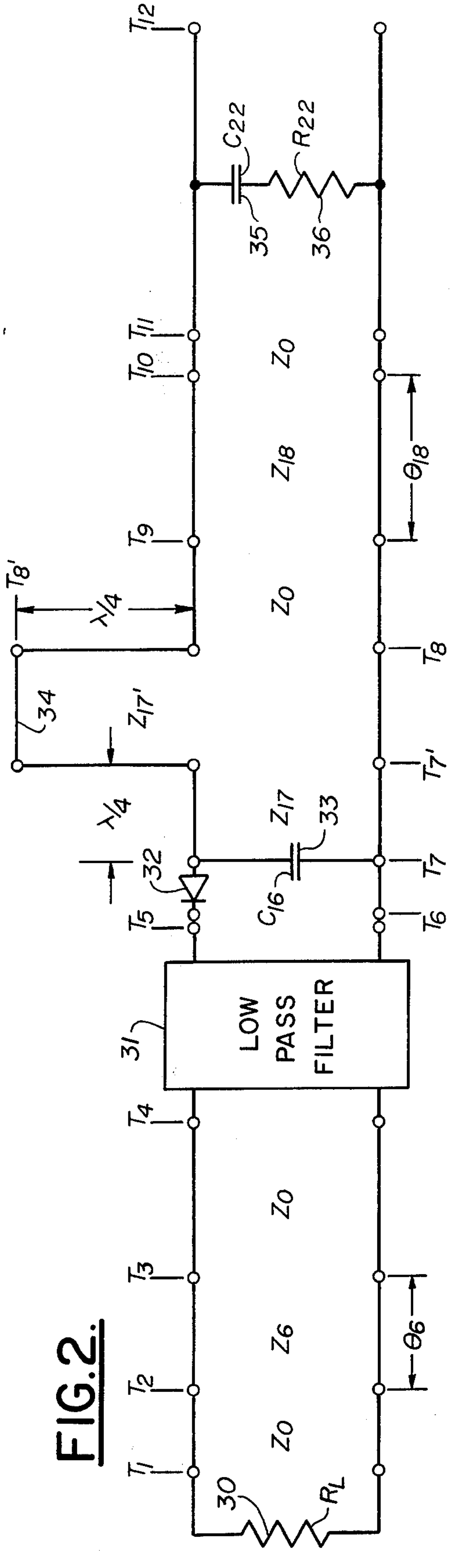
FIG. 2 presents an equivalent circuit useful in explaining the device of FIG. 1.

The structure and operation of the invention may be further understood by simultaneous reference to FIGS. 1 and 2, FIG. 2 representing a two-wire transmission line equivalent of the network of FIG. 1, corresponding reference planes again being represented by the designations $T_1$ through $T_{12}$. To the left of reference plane $T_7$ are seen the equivalents of the components of the active part of the apparatus. For example, resistor 30 having a resistance $R_L$, represents the load of the apparatus. The impedance $Z_6$ of length $O_6$ between reference planes $T_2$ and $T_3$ represents the impedance control element 6 of FIG. 1, on each side of which the coaxial line 1, 2 provides sections of characteristic impedance $Z_O$. The distributed filter 9 of FIG. 1 is represented between reference planes $T_4$ and $T_5$ in FIG. 2 by the low pass filter 31. Diode 32 in FIG. 2 is analogous to diode 12, being coupled between reference planes $T_6$ and $T_7$.

To the right of reference plane $T_7$, the capacitive disk 16 is placed, its surface 15 lying in plane $T_7$. The effect of disk 16 is represented by the shunt capacitor 33 in FIG. 2 having a capacitance $C_{33}$. Th capacitive disk 16 at plane $T_7$ guarantees that the active part of the device is terminated by a low impedance for all harmonics of frequency greater than the fourth harmonic. In addition, it beneficially serves as a source of charge for the excitation of the avalanche shock front required for TRAPATT operation of diode 12. The As previously described, there is affixed concentrically on the second major surface of disk 16 a conductive tube one quarter wave in length so that it represents a half wave folded choke at the operating fundamental frequency $f_F$. The equivalent circuit of this element is shown in FIG. 2 as lying between reference planes $T_7$ and $T_8$. The corresponding sections of transmission line are represented in FIG. 2 as having impedances $Z_{17}$ and $Z_{17}'$ and are both electrically a quarter wave long at frequency $f_F$. The impedance levels $Z_{17}$ and $Z_{17}'$ are functions of the dimensions of folded choke 16, 17 each being less than the characteristic impedance $Z_O$ of the coaxial line section lying, for example, between the adjacent reference planes $T_8$ and $T_9$. The branching transmission line 34 in FIG. 2 is a quarter wave in length at $f_F$ and is a shorted line section in series with the main transmission line, the short appearing at impedance reference plane $T_8'$.

At the fundamental frequency $f_F$ and at all odd harmonics thereof, the short circuit in impedance reference plane $T_8'$ is transformed to an effective open circuit at the reference plane $T_7'$ - $T_8$, this effective open circuit impedance being coupled in series with the terminals in reference plane $T_8$. The net impedance at reference plane $T_7'$ is therefore an open circuit and is transformed to a short circuit at reference plane $T_7$ by the folded choke 17. Thus, the effective input impedance for energy attempting to propagate to the right of reference plane $T_7$ is a short circuit at the fundamental frequency and for all odd harmonics and is thus independent of the nature of the remainder of the circuit to the right of reference plane $T_8$. The presence of disk 16 accordingly guarantees that a substantially zero impedance circuit forms a wall at reference plane $T_7$ against rightward propagation of fundamental and odd harmonic energy.

Independent control of even harmonic energy may now be effected by elements found to the right of reference plane $T_7$. For even harmonics, the short circuit produced by the folded choke at reference plane $T_8'$ is transformed to an effective short circuit in the reference plane of terminals $T_7'$ - $T_8$. Thus, the impedance seen at reference plane $T_7'$ is the same as that at reference plane $T_8$, the folded choke 16, 17 having no effect over the situation. Accordingly, the effective input impedance of all even harmonic energy attempting to flow to the right through reference plane $T_7$ is the same as that at reference plane $T_8$. Control over the impedance level at reference plane $T_8$ therefor achieves independent control of the impedance seen by second harmonic energy for the improvement of the TRAPATT operation of diode 12.

Figure 3:
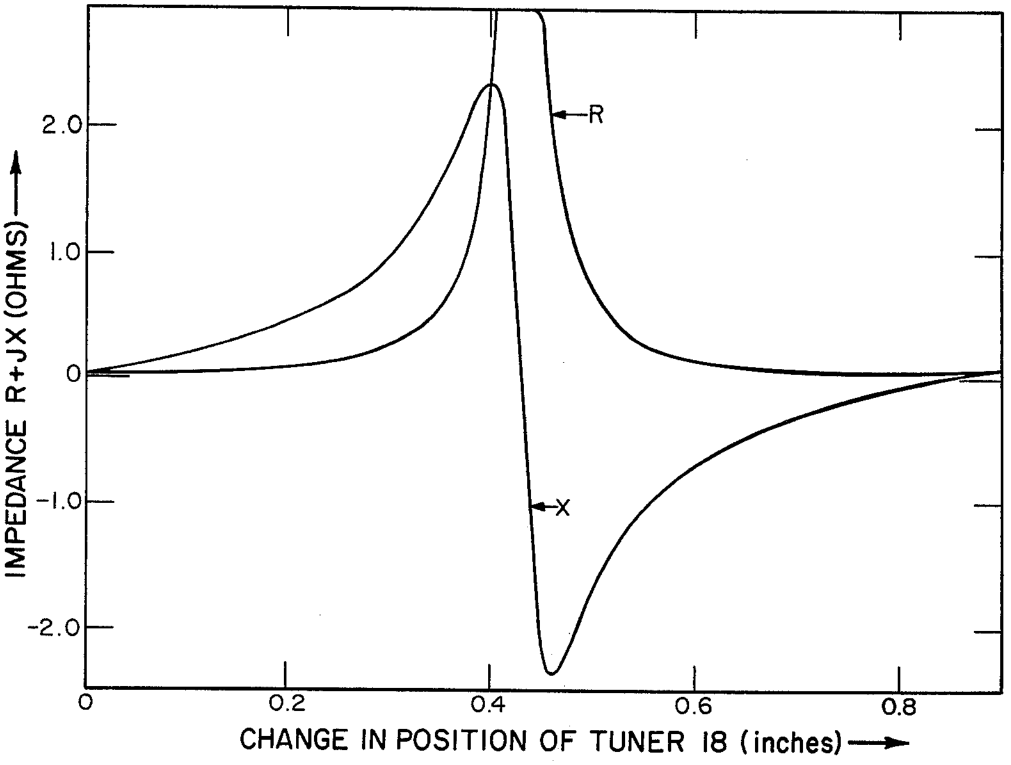
FIG. 3 is a graph illustrating operation of the invention.

The impedance matching element 18, which is represented as an element having impedance $Z_{18}$, is found in FIGS. 1 and 2 lying between reference planes $T_9$ and $T_{10}$. It is possible to adjust the circuit for control of harmonic frequency energy in the desired manner by variation in known ways of the position, length, or characteristic impedance $Z_{18}$ of the element 18. For example, FIG. 3 illustrates the range of variation of the second harmonic impedance as a function of the change in location of element 18 for a predetermined length and impedance of that element 18. In consequence, the folded choke mounting for diode 12 provides an improved circuit arrangement for increasing the efficiency of TRAPATT converter devices, the use of the circuit in I-band TRAPATT oscillators having resulted in typical increases in efficiency of 26 to 33 per cent. Improvement in gain, as well as in efficiency, has been experimentally observed.

The absorber 22 lying between impedance reference planes $T_{11}$ and $T_{12}$ may be represented as in FIG. 2 by a series connected capacitor 35 of capacitance $C_{22}$ and resistor 36 of resistance $R_{22}$ coupled in shunt across the transmission line. At the fundamental and harmonic frequencies of interest, the absorber 22 behaves as a matched lossy transmission line for any low level signals tending to exit from the right hand end of the converter; similarly, spurious signals arising from vicinal equipment are substantially prevented from entering the converter. It will be recognized by those skilled in the art that, under certain operational circumstances, absorber 22 may be omitted from the structure.

Figure 4:
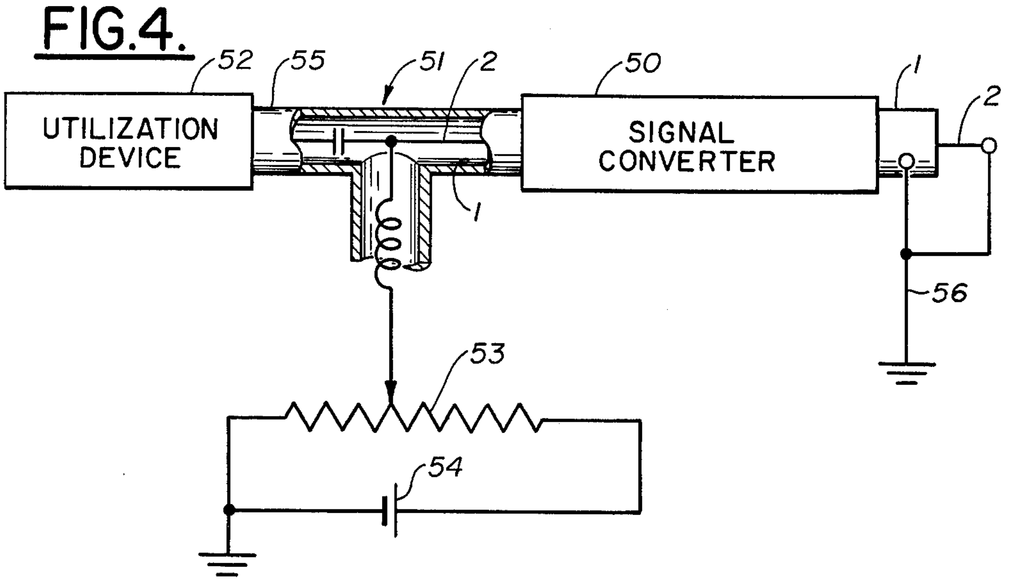
FIg. 4 illustrates, in partial section, one application of the invention.

It will also be understood by those skilled in the art that a suitable bias voltage may be supplied across diode 12 using known bias circuits such as that illustrated generally in FIG. 4, which also illustrates one form of apparatus for making use of the invention. For example, the system may include a signal converter 50 such as that of FIG. 1 represented as operating as a high frequency oscillator for the supply of energy to a utilization device 52. In FIG. 4, the coaxial line 1, 2 of the signal generator 50 is coupled through a conventional bias tee junction 51 and flows substantially undisturbed to any desired utilization device 52. The role of the bias tee junction 51 is to supply a circuit path completed by the grounded circuit 56 for the application of the bias field across diode 12 of FIG. 1. The bias field so imposed may be adjusted in magnitude by the use of potentiometer 53 across which the unidirectional voltage supply 54 is coupled. In this manner, with conductors 1 and 2 grounded at the absorber end of the converter, a circuit is completed for biasing the diode 12 within a few volts of its reverse break down level. If the apparatus of FIg. 4 is used as an amplifier, the device 52 will include the aforementioned signal source and signal circulator and apparatus for using the amplified signal in the usual manner.

Accordingly, the invention is an improved microwave or high frequency signal converter employing a high-efficiency-mode semiconductor diode as an active negative resistance device in a transmission line network. A filter network located at the diode has a stop band containing certain harmonics $f_H$ of the frequency $f_F$ of the signal to be amplified, while being transparent to the latter signal $f_F$. The network is tuned to resonate the signal frequency $f_F$ to be amplified. With the special location of the filter, time delayed triggering of the diode is not induced. Impedance control elements within the active section of the converter are provided for establishing proper control over the fundamental and odd harmonic frequency energy. On the other hand, impedance control elements located in the bias circuit of the converter remote from the diode provide independent control over even harmonic energy in the vicinity of the diode. Thus, independent agencies afford full control for retaining high frequency energy within the region of the TRAPATT diode, improving significantly the direct current to high frequency energy conversion of the converter. In operation, the novel improvement has yielded in TRAPATT oscillators operating in the I-band typical efficiency increases of 26 to 33 percent, for example.

While the invention has been described in its preferred embodiments, it is to be understood that the words which have been used are words of description rather than of limitation, and that changes within the purview of the appended claims may be made without departing from the true scope and spirit of the invention in its broader aspects.

I claim:

1. A high frequency energy converter comprising:

first and second conductor means spaced apart in longitudinally aligned relation, third conductor means coextensive with said first and second conductor means, semiconductor means forming first and second conductive junction means at said first and second conductor means, distributed filter means conductively disposed on one of said first or third conductor means adapted to pass high frequency fundamental energy, first impedance matching means spaced with respect to said distributed filter means opposite said semiconductor means and conductively disposed on one of said first or third conductor means, capacitive means coupled to said second conductor at said second junction for forming a substantial short circuit between said second and third conductor means with respect to harmonics of said high frequency fundamental energy greater than the fourth harmonic thereof, folded choke means conductively disposed on said capacitive means for forming a substantial short circuit at said second junction means between said second and third conductor means with respect to said high frequency fundamental energy and odd harmonics thereof, and second impedance matching means spaced with respect to said folded choke means opposite said semiconductor means and conductively disposed on one of said second or third conductive means for independently controlling the impedance between said second and third conductor means at said second junction means with respect to even harmonics of said fundamental frequency energy.

2. Apparatus as described in claim 1 wherein said semiconductor means comprises high efficiency semiconductor diode means.

3. Apparatus as described in claim 1 wherein said first and third conductor means comprise coaxial line means.

4. Apparatus as described in claim 2 wherein said capacitive means comprises conductive disk means disposed on said second conductor means in symmetric capacity coupled relation to said third conductor means.

5. Apparatus as described in claim 4 wherein said folded choke means comprises conducting tubular means substantially symmetrically disposed on said conductive disk means opposite said semiconductor diode means and substantially coaxial with respect to said second and third conductor means.

6. Apparatus as described in claim 5 wherein the length of said conducting tubular means is one quarter of the wave length of said fundamental frequency.

7. Apparatus as described in claim 5 wherein said first and second impedance matching means cooperatively furnish support for said first and second conductor means within said third conductor means.

8. Apparatus as described in claim 5 additionally including high frequency energy absorber means disposed between said second and third conductor means spaced from said second impedance matching means opposite said folded choke means.

* * * * *